US007355113B2

(12) United States Patent
Itoigawa et al.

(10) Patent No.: US 7,355,113 B2

(45) Date of Patent: Apr. 8, 2008

(54) THERMOELECTRIC CONVERSION DEVICE AND METHOD OF MANUFACTURING THE SAME

(75) Inventors: Kouichi Itoigawa, Aichi (JP); Hiroshi Ueno, Aichi (JP); Susumu Sugiyama, Shiga-ken (JP); Toshiyuki Toriyama, Shiga-ken (JP)

(73) Assignees: Kabushiki Kaisha Tokai Rika Denki Seisakusho, Niwa-gun, Aichi (JP); The Ritsumeikan Trust, Kyoto-shi, Kyoto (JP)

( * ) Notice: Subject to any disclaimer, the term of this patent is extended or adjusted under 35 U.S.C. 154(b) by 865 days.

(21) Appl. No.: 10/745,832

(22) Filed: Dec. 24, 2003

(65) Prior Publication Data

US 2004/0134530 A1 Jul. 15, 2004

(30) Foreign Application Priority Data

Dec. 24, 2002 (JP) ............................ 2002-372997

(51) Int. Cl.
*H01L 35/32* (2006.01)

(52) U.S. Cl. ...................................... 136/205; 136/241

(58) Field of Classification Search ................ 136/205, 136/241
See application file for complete search history.

(56) References Cited

U.S. PATENT DOCUMENTS 6,288,321 B1 * 9/2001 Fleurial et al. ............. 136/205

FOREIGN PATENT DOCUMENTS

JP 2002-050801 2/2002

* cited by examiner

*Primary Examiner*—Kaj K. Olsen
(74) *Attorney, Agent, or Firm*—Colin P. Cahoon; Carstens & Cahoon, LLP

(57) ABSTRACT

A thermoelectric conversion device for securely fixing a junction of a thermocouple to a top plate while ensuring heat transfer between the junction and the top plate. The thermoelectric conversion device includes a substrate having a main surface, a top plate facing the main surface of the substrate, and a plurality of series-connected thermocouples. Each thermocouple has a first end including a first junction and a second end including a second junction. The first junction of each thermocouple is fixed to the main surface of the substrate and the second junction of each thermocouple is provided with a bump for attaching the second junction to the top plate in such a way that the second junction is separated from the substrate.

7 Claims, 5 Drawing Sheets

P1 25a 13 25b 31 26 27 P1 14 13 31 11
15 30 P2 25a 30 P2 15
21 M2 25 13a 12a 21 20 12 21 25 M2 13a 25b

THERMOELECTRIC CONVERSION DEVICE AND METHOD OF MANUFACTURING THE SAME

BACKGROUND OF THE INVENTION

The present invention relates to a thermoelectric conversion device utilizing the Seebeck effect in which power is generated from the temperature difference between a hot junction and a cold junction, and to a method of manufacturing the same.

Conventionally, a thermoelectric conversion device has been used as a power supply or an auxiliary power supply of an electronic device, a temperature sensor or an infrared ray sensor. For example, the thermoelectric conversion device disclosed in Japanese Laid-Open Patent Publication No. 2002-50801 includes a plurality of series-connected thermocouples. Each thermocouple is L-shaped and has a parallel section parallel to a substrate and a perpendicular section perpendicular to the substrate.

In the thermoelectric conversion device of the above-mentioned publication, a glass layer is formed on the substrate, and the plurality of thermocouples, each including a first junction and a second junction, are formed on the glass layer. The first junction is formed on a first end of the thermocouple and the second junction on a second end of the thermocouple. The glass layer, except for the region corresponding to the first junction of each of the thermocouples, is removed, and thus each of the thermocouples is held like a cantilever. Subsequently, each of the thermocouples besides the first junction region (the parallel section) is bent perpendicular to the substrate to form a perpendicular section.

Next, in each of the thermocouples, the region except for the distal end of the perpendicular section (second junction) is filled with resist. Then, for example, semiconductor or metal is deposited on the resist to form a top plate. Afterwards, the resist is removed. As a result, the second junction and the top plate are adhered together. By adhering the second junction and the top plate, heat is smoothly transferred between the second junction and the top plate. This increases the thermoelectric conversion of the thermoelectric conversion device.

However, it is troublesome to form each of the plurality of thermocouples in the conventional thermoelectric conversion device since each of the thermocouples must be bent individually in order to form the parallel section and the perpendicular section. Furthermore, if the height of the second junction of each perpendicular section is not equal, there is a possibility that each of the second junctions and the top plate do not adhere securely. This would affect the thermoelectric conversion between the second junctions and the top plate.

SUMMARY OF THE INVENTION

One aspect of the present invention is a thermoelectric conversion device having a substrate including a main surface and a top plate arranged facing the main surface of the substrate. A plurality thermocouples are connected in series. Each thermocouple has a first end including a first junction and a second end including a second junction. The first junction of each of the plurality of thermocouples is fixed to the main surface of the substrate. The second junction of each of the plurality of thermocouples is provided with a bump for fixing the second junction to the top plate in such a way that the second junction is separated from the substrate.

Another aspect of the present invention is a method of manufacturing a thermoelectric conversion device including a substrate having a main surface and a top plate facing the main surface of the substrate. The method includes the steps of forming a pad on the top plate, forming a sacrifice layer on the substrate, and forming a thermocouple, having a first end including a first junction and a second end including a second junction, on the sacrifice layer. The method also includes the steps of forming a bump on the second junction of the thermocouple, thermo-compression bonding the bump to the pad, removing the sacrifice layer excluding a portion corresponding to the first junction of the thermocouple and leaving a remaining sacrifice portion on the substrate, and separating the substrate and the top plate by a predetermined distance so that the second junction of the thermocouple is separated from the main surface of the substrate.

A further aspect of the present invention is a method of manufacturing a thermoelectric conversion device including a substrate having a main surface and a top plate facing the main surface of the substrate. The method includes the steps of forming a plurality of pads on the top plate, and forming a plurality of thermocouples connected in series, each thermocouple having a first end including a first junction and a second end including a second junction. the method also includes the steps of forming a bump on the second junction of each of the plurality of thermocouples, thermo-compressing bonding the bump of the second junction in each of the plurality of thermocouples to a corresponding one of the pads, separating the second junction of each of the plurality of thermocouples from the main surface of the substrate in a direction perpendicular to the main surface of the substrate, and separating the substrate and the top plate so that the second junction of each of the plurality of thermocouples are separated from the main surface of the substrate in the direction perpendicular to the main surface of the substrate.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
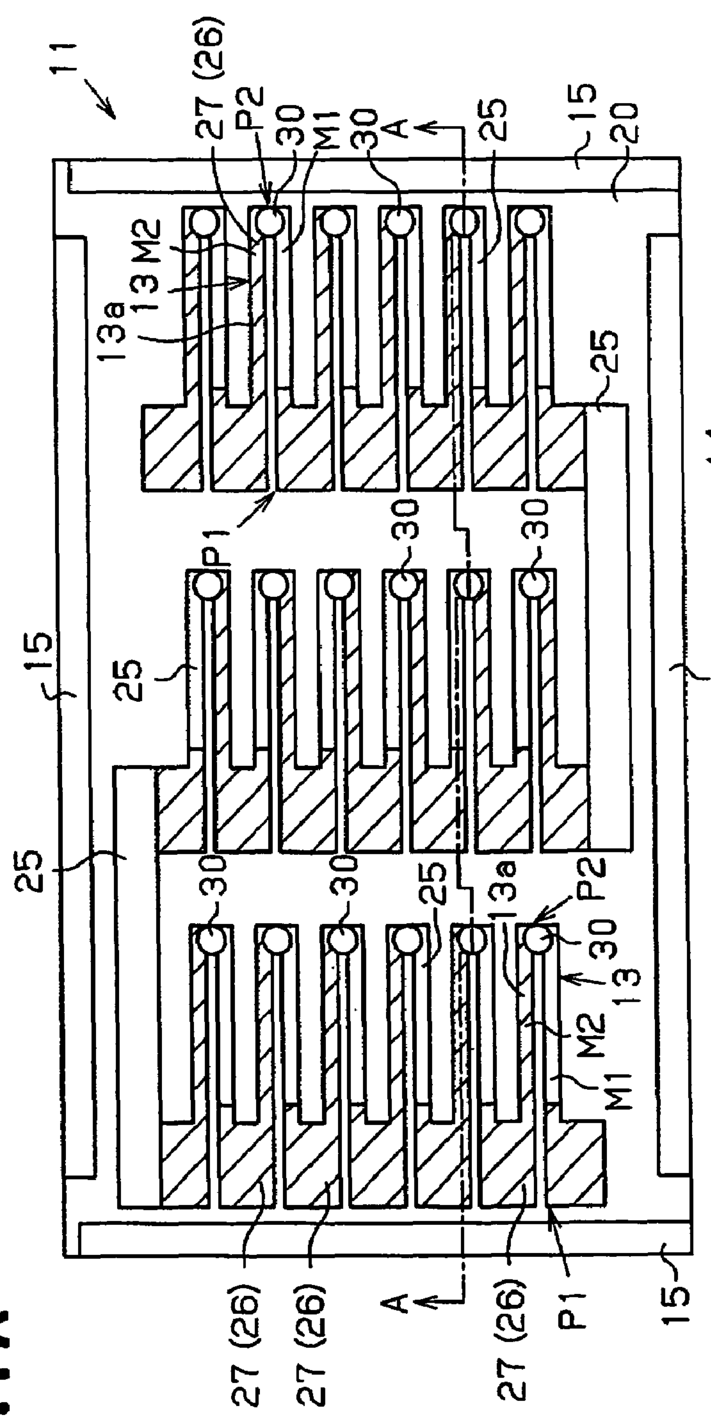
FIG. 1A is a schematic top view of a thermoelectric conversion device according to one embodiment of the present invention.

In the drawings, like numerals are used for like elements throughout.

Figure 1B:
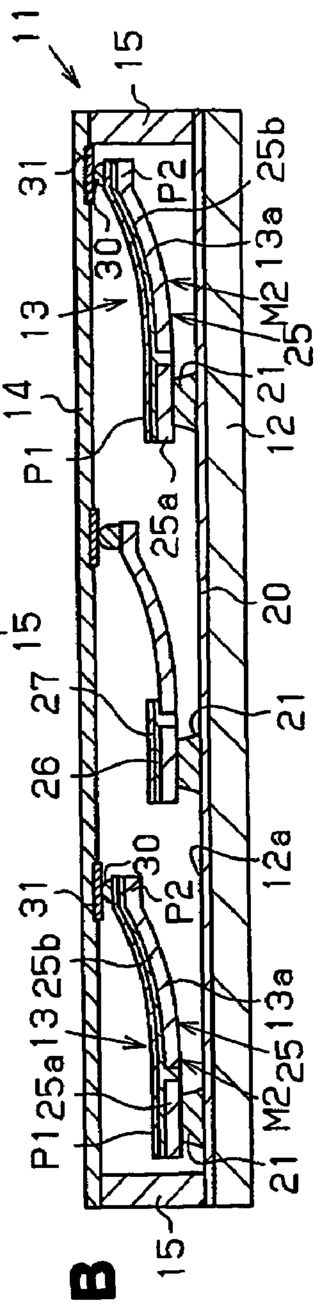
FIG. 1B is a cross sectional view taken along line A-A of FIG. 1A.
Figure 11:
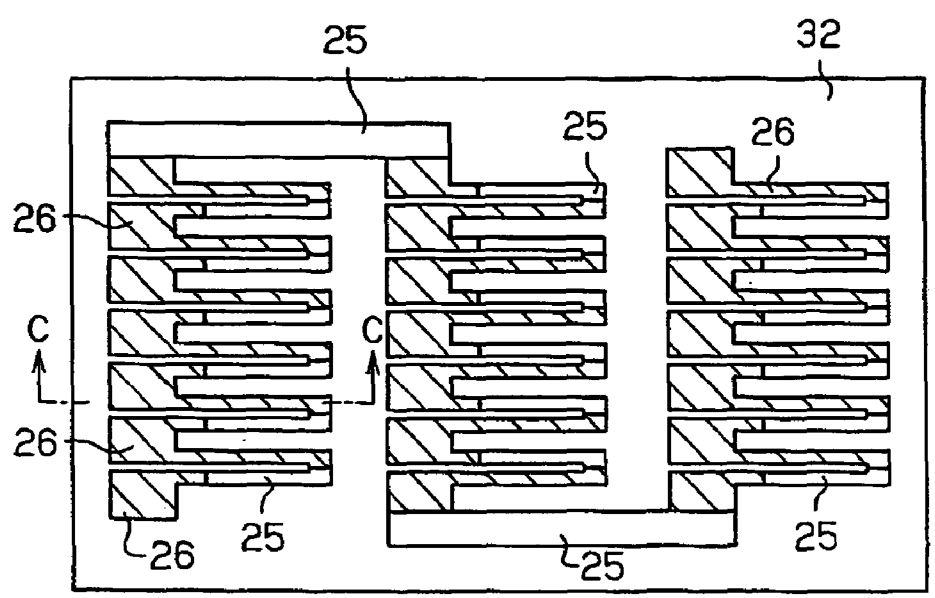

As shown in FIG. 1A and FIG. 1B, a thermoelectric conversion device 11 according to one embodiment of the present invention includes a substrate 12 made from silicon, a plurality of series-connected thermocouples 13, a top plate 14, and spacers 15. Each of the thermocouples 13 has a first end including a first junction P1 and a second end including a second junction P2. The area representing a metal film 27 in FIG. 1A and the area representing a metal film 26 in FIG. 11 are shaded for the sake of convenience of explanation.

The substrate 12 has a main surface 12*a* on which an insulating layer 20 made of silicon nitride ($Si_3N_4$) or silicon dioxide ($SiO_2$) is formed. A thermocouple support 21 made of phosphorus glass is formed on the upper surface of the insulating layer 20 for each thermocouple 13. The first junction P1 of each thermocouple 13 is fixed to the corresponding thermocouple support 21. In other words, the first junction P1 of each thermocouple 13 is fixed to the main surface 12*a* of the substrate 12 by the insulating layer 20 and the corresponding thermocouple support 21.

Figure 10:
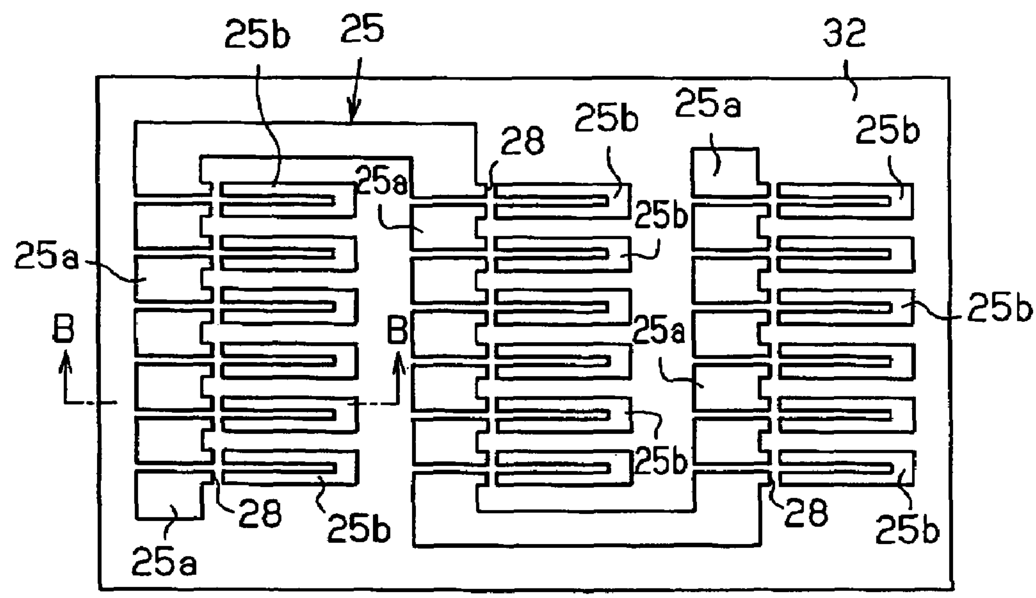
FIGS. 10 and 11 are top views showing steps in manufacturing the thermoelectric conversion device.

As shown in FIG. 1B, each of the thermocouples 13 includes a base layer 25 made of polycrystalline silicon, a metal film 26 made of chromium (Cr) and a metal film 27 made of gold (Au). The base layer 25 has, as shown in FIG. 10, a meandering pattern including a dividing groove 28. As shown in FIG. 11, the metal film 26 is formed on a predetermined range on the base layer 25, and the metal film 27 is superimposed thereon.

Each of the thermocouples 13 includes, as shown in FIG. 1A, a single-layer portion M1 and a multi-layer portion M2. The single-layer portion M1 is formed with only the base layer 25, and the multi-layer portion M2 is formed with the base layer 25, the metal film 26, and the metal film 27. The single-layer portion M1 and the multi-layer portion M2 are arranged so as to be parallel to each other.

A typical thermocouple is usually formed by connecting two kinds of material. However, in the thermocouple 13 of the preferred embodiment, one of the materials (single-layer portion M1) consists only of polycrystalline silicon and the other material (multi-layer portion M2) consists of chromium wire, metal wire and polycrystalline silicon. Nevertheless, the thermocouple 13 of such structure still functions as a thermocouple and is easily manufactured.

In each of the thermocouples 13, one side of the first junction P1 corresponds to the single-layer portion M1 while the other side corresponds to the multi-layer portion M2. The side of the first junction P1 corresponding to the single-layer portion M1 in one thermocouple 13 is connected to the side of the first junction P1 corresponding to the multi-layer portion M2 in the adjacent thermocouple 13. Further, in each thermocouple 13, the ends opposite the sides of the first junction P1 corresponding to the single-layer portion M1 and the multi-layer portion M2 are connected to each other. The connecting portion is referred to as the second junction P2. A bump 30 made of gold is formed on the upper surface of the second junction P2 in each thermocouple 13.

Four spacers 15 are fixed to the peripheral edge of the insulating layer 20 on the substrate 12. The top plate 14 is fixed to the spacers 15. The top plate 14 made of polyimide resin mixed with black body material (for example, cobalt oxide) is fixed to the spacer 15 parallel to the substrate 12. A plurality of lands 31 made of gold (Au) are each formed on the top plate 14 at a position corresponding to the position of a corresponding one of the corresponding bumps 30. The land 31 is equivalent to a pad.

Each thermocouple 13 includes a region (hereinafter referred to as a deflecting portion 13*a*) located near the second junction P2 that is deflected upward (away from the substrate 12) to bond the bump 30 to the corresponding land 31. The bump 30 connects the second junction P2 of the thermocouple 13 to the corresponding land 31 of the top plate 14.

The amount of deflection of the deflecting portion 13*a* is determined by the height of each spacer 15 (dimension of the spacer 15 in a direction away from the substrate or a separating direction) placed between the substrate 12 and the top plate 14. The separating direction is the direction orthogonal to the main surface 12*a* of the substrate 12.

Now, a method of manufacturing the thermoelectric conversion device 11 of the present embodiment will be explained. In FIG. 2 to FIG. 9, only one thermocouple 13 will be illustrated.

Figure 2:
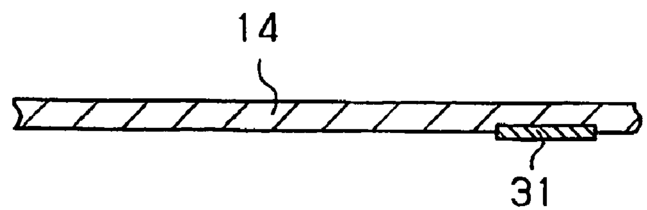
FIG. 2 is a partial sectional view showing a step of manufacturing the thermoelectric conversion device of FIG. 1A.

First, as shown in FIG. 2, a plurality of lands 31 (only one land 31 is shown in FIG. 2) is formed on the surface of the top plate 14 facing the main surface 12*a* of the substrate by performing, for example, sputtering or gold plating.

Figure 3:
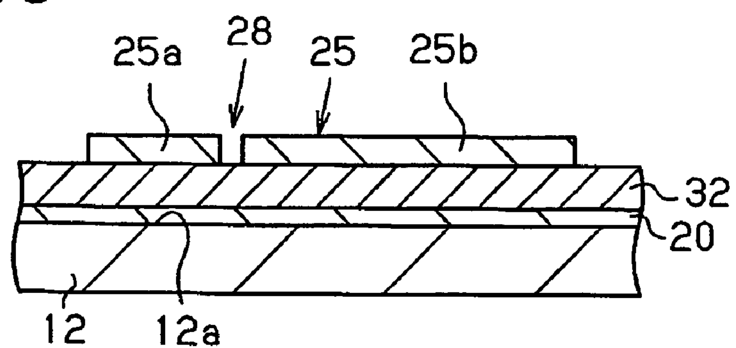
FIG. 3 is a cross sectional view taken along line B-B of FIG. 10 and a partial sectional view showing a step in manufacturing the thermoelectric conversion device.

Next, as shown in FIG. 3, an insulating layer 20 is formed on the entire main surface 12*a* of the substrate 12 by means of for example, low pressure chemical vapor deposition (LPCVD). Subsequently, a glass layer 32, which functions as a sacrifice layer, is formed on the entire surface of the insulating layer 20 by means of for example, atmospheric pressure chemical vapor deposition (APCVD). Furthermore, a layer of polycrystalline silicon is formed on the entire surface of the glass layer 32 using for example, LPCVD. The polycrystalline silicon layer formed on the glass layer 32 is coated with a mask (not shown) and is subjected to photo-etching process, to form a base layer 25 having a meandering pattern (refer to FIG. 3 and FIG. 10).

During photo-etching, a dividing groove 28 for dividing the meandering pattern of the base layer 25 is formed in the base layer 25 along the direction in which the thermocouples 13 are arranged (vertical direction in FIG. 10). As shown in FIG. 10, the dividing groove 28 divides the base layer 25 into a fixed portion 251 and a lifting portion 25*b*. The fixed portion 251 is the region corresponding to the first junction P1 of the thermocouple 13. The lifting portion 25*b* is the region of the thermocouple 13 located closer toward the second junction P2 than the fixed portion 251. The deflecting portion 13*a* includes the lifting portion 25*b*, the region of the metal film 26 corresponding to the lifting portion 25*b*, and the region of the metal film 27 corresponding to the lifting portion 25*b*.

Figure 4:
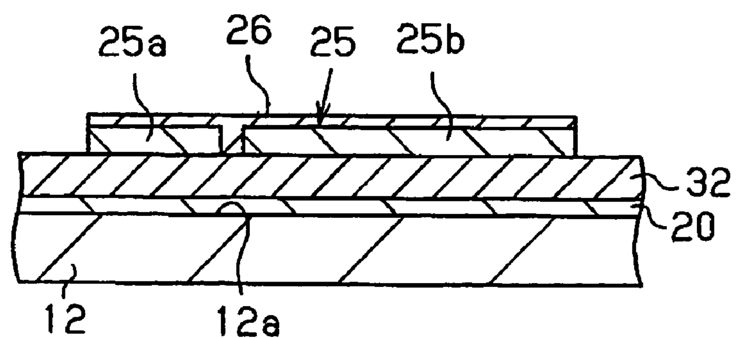
FIG. 4 is a cross sectional view taken along line C-C of FIG. 11 and a partial sectional view showing a step in manufacturing the thermoelectric conversion device.

After depositing chromium on the fixed portion 251, the lifting portion 25*b*, and the glass layer 32, a wet etching process, for example, is carried out on the deposited chromium to form the metal film 26 (refer to FIG. 4 and FIG. 11). The metal film 26 is formed on the fixed portion 251, the lifting portion 25*b*, and in the dividing groove 28, which separates the fixed portion 251 and the lifting portion 25*b*. The metal film 26 formed in the dividing groove 28 forms a bendable connecting portion.

Figure 5:
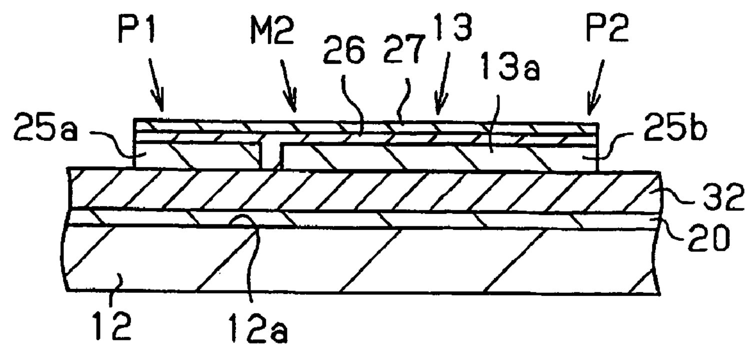
FIGS. 5 to 9 are partial sectional views showing steps in manufacturing the thermoelectric conversion device.

Furthermore, referring to FIG. 11, after depositing gold to the metal film 26 and the glass layer 32, wet etching process, for example, is carried out on the deposited gold to form the metal film 27 (refer to FIG. 1 and FIG. 5). As a result, the fixed portion 251, the lifting portion 25*b*, the metal film 26, and the metal film 27 applied to the glass layer 32 form the thermocouples 13.

Figure 6:
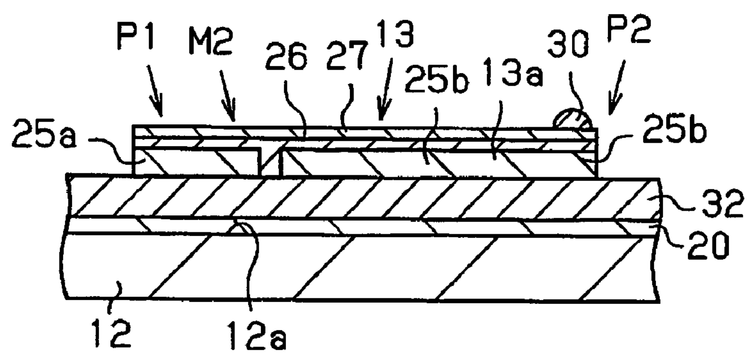
Figure 7:
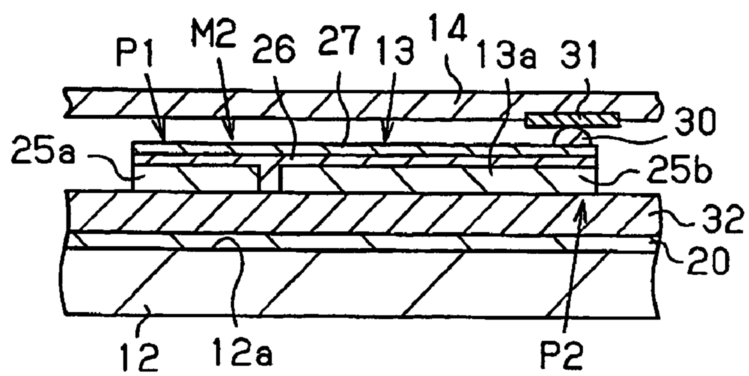

Next, as shown in FIG. 6, the bump 30 is formed on the second junction P2 of each thermocouple 13 by means of, for example, wire bonding or gold plating. Thereafter, the lands 31 of the top plate 14 and the corresponding bumps 30 formed on the second junction P2 of the thermocouples 13 are bonded together by means of thermo-compression bonding, as shown in FIG. 7.

Figure 8:
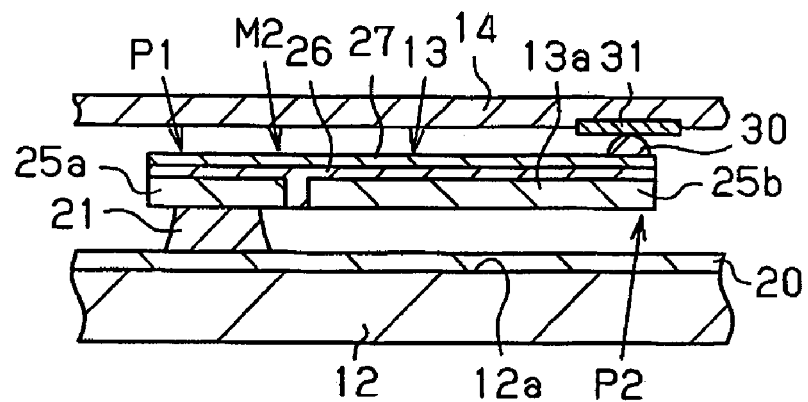

Subsequently, the entire glass layer 32 except for the region corresponding to the first junction P1 of each of the thermocouples 13 is released by, for example, hydrofluoric acid in order to form the thermocouple support 21 from the glass layer 32, as shown in FIG. 8. The thermocouple support 21 separates the first junction P1 from the main surface 12*a* of the substrate 12 by a predetermined distance (first distance). The fixed portion 251 supports the corresponding lifting portion 25*b* with the metal film 26 and 27.

Figure 9:
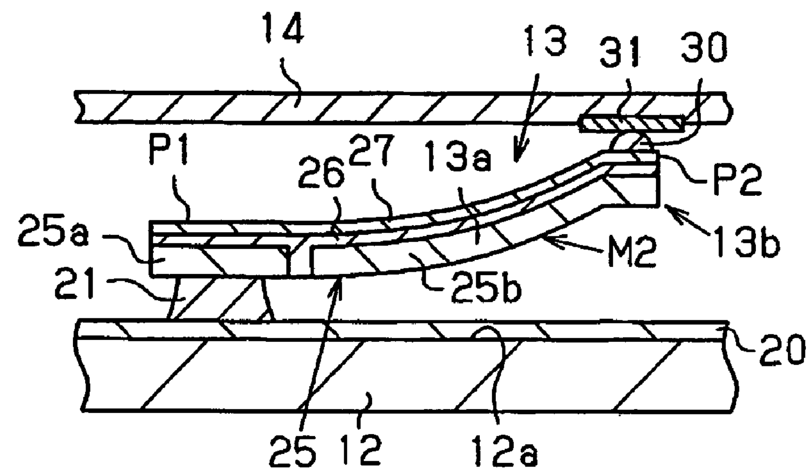

Next, as shown in FIG. 9, the substrate 12 and the top plate 14 are separated from each other so that the second junction P2 of each of the thermocouples 13 and the main surface 12*a* of the substrate 12 are spaced apart by a predetermined distance (second distance) in the separating direction. The separating direction corresponds to the vertical direction in FIG. 9. The second distance is greater than the first distance. Here, the second junction P2 of each thermocouple 13 moves away from the substrate 12 as the deflecting portion 13*a* deflects. Furthermore, as shown in FIG. 1B, the spacers 15 are arranged between and fixed to the substrate 12 and the top plate 14.

The thermoelectric conversion device 11 of the present embodiment has the following advantages.

(1) The second junctions P2 of the thermocouples 13 in the thermoelectric conversion device 11 are bonded to the top plate 14 by the bumps 30. Thus, even if the height of the second junction P2 varies between thermocouples 13, each bump 30 is deformed in accordance with such difference during thermo-compression bonding. This ensures that the second junctions P2 and the top plate 14 are bonded to each other and that heat is reliably transferred between the second junctions P2 and the top plate 14.

(2) The second junction P2 of each thermocouple 13 is separated from the substrate 12. Thus, the thermoelectric conversion efficiency is increased without heat being directly transferred from the substrate 12 to the second junction P2 of each thermocouple 13.

In other words, one of the first junctions P1 and the second junctions P2 of the thermocouples 13 function as hot junctions and the other function as cold junctions. Furthermore, the first junction P1 of each thermocouple 13 is connected to the substrate 12 by the corresponding thermocouple support 21. Thus, heat is directly transferred from the substrate 12 to the first junction P1. On the other hand, the second junction P2 of each of the thermocouples 13 is separated from the substrate 12. Thus, heat is not directly transferred from the substrate 12 to the second junction P2. This increases the temperature difference between the first junction P1 and the second junction P2.

(3) The spacers 15 provided between the substrate 12 and the top plate 14 allows the second junction P2 of each thermocouple 13 to be separated from the substrate 12 when the deflecting portion 13*a* of the thermocouple 13 is deflected. Therefore, the distance between the second junction P2 of each thermocouple 13 and the substrate 12 is adjusted as required by setting the spacer 15 to a desired length (length refers to the dimension in the separating direction).

(4) The bump 30 formed on the second junction P2 of each thermocouple 13 is bonded to each of the corresponding lands 31 formed on the top plate 14 by means of thermo-compression bonding. Thus, the thermocouples 13 are bonded to the top plate 14 simultaneously.

(5) Before removing the unnecessary part of the glass layer 32, each land 31 on the top plate 14 is bonded to the corresponding bump 30 formed on each of the thermocouples 13 by means of thermo-compression bonding. Thus, the second junction P2 of each of the thermocouples 13 is adhered to the top plate 14 simultaneously. In other words, the thermocouples 13 are formed simultaneously. Accordingly, compared to the conventional thermocouple disclosed in the previously mentioned publication, the thermocouples 13 are more easily formed.

(6) The bumps 30 and the lands 31 are both made of gold (Au). Therefore, the temperature during thermo-compression bonding can be lowered as compared to when forming the bump 30 with solder and the land 31 with copper. As a result, overheating of the thermoelectric conversion device due to thermo-compression bonding is suppressed.

(7) The thermoelectric conversion device 11 of the preferred embodiment can be used in various applications such as power generation using industrial waste energy, power generation using exhaust gas heat of automobiles, power generation using heat release from substrates in electronic devices such as personal computers, power generation using body temperature in wrist watches, temperature sensors or infrared sensors.

(8) The lifting portions 25*b* are supported by the corresponding fixed portions 251 by the metal film 26 and 27. The metal film 26, which is made of chromium (Cr), and the metal film 27, which is made of gold (Au), are ductile. In comparison, the base layer 25 made of polycrystalline silicon is not ductile. Therefore, the region of the metal film 26 and 27 corresponding to the dividing groove 28 (refer to FIG. 3) enables the region corresponding to the lifting portion 25*b* of the thermocouple 13 to be bent.

It should be apparent to those skilled in the art that the present invention may be embodied in may other specific forms without departing from the spirit or scope of the invention. Particularly, it should be understood that the invention may be embodied in the following forms.

Polysilicon layer (polycrystalline silicon layer) may be used as the sacrifice layer (glass layer 32).

Each bump 30 may be made from solder and each land 31 from copper (Cu). In this case, each bump 30 made from solder is formed on the second junction P2 of each of the thermocouples 13 by means of solder plating. Each bump 30 and each of the corresponding lands 31 are bonded together by means of thermo-compression bonding.

The substrate 12 and the top plate 14 may be fixed with any method other than using the spacer 15 as long as the relative position of the substrate 12 and the top plate 14 can be adjusted.

The spacer 15 may be fixed to only one of either the substrate 12 or the top plate 14.

The thermoelectric conversion device 11 may be formed without deflecting the deflecting portion 13*a*, but with the second junction P2 spaced apart from the substrate 12 (insulating layer 20).

Therefore, the present examples and embodiments are to be considered as illustrative and not restrictive and the invention is not to be limited to the details given herein, but may be modified within the scope and equivalence of the appended claims.

What is claimed is:

1. A thermoelectric conversion device comprising:

a substrate including a main surface;

a top plate arranged facing the main surface of the substrate; and a plurality of thermocouples connected in series, each thermocouple having a first end including a first junction, a second end including a second junction, and a deflecting portion provided between the first and second ends, wherein:

the first junction of each of the plurality of thermocouples is fixed to the main surface of the substrate; and the second junction of each of the plurality of thermocouples is provided with a bump for fixing the second junction to the top plate when the deflecting portion is deflected so that the second junction is separated from the substrate.

2. The thermoelectric conversion device as claimed in claim 1, wherein:

the first junction of each of the plurality of thermocouples is separated from the main surface of the substrate by a first distance in a direction perpendicular to the main surface of the substrate; and the bump on the second junction of each of the plurality of thermocouples fixes the second junction to the top plate in such a way that the corresponding second junction is separated from the main surface of the substrate by a second distance that is greater than the first distance in the direction perpendicular to the main surface of the substrate.

3. The thermoelectric conversion device as claimed in claim 1, wherein the thermoelectric conversion device further comprising:

spacer provided between the substrate and the top plate and fixed to at least one of either the substrate or the top plate to separate the second junction of each of the plurality of thermocouples from the main surface of the substrate in the direction perpendicular to the main surface of the substrate.

4. The thermoelectric conversion device as claimed in claim 1, wherein the top plate includes a plurality of pads, each being formed at a position corresponding to a position of the bump on the second junction of one of the plurality of thermocouples so as to be bonded to the bump.

5. The thermoelectric conversion device as claimed in claim 4, wherein the bump on the second junction of each of the plurality of the thermocouples and the plurality of pads are made of gold.

6. The thermoelectric conversion device as claimed in claim 1, wherein the thermoelectric conversion device further comprises a plurality of thermocouple supports provided between the substrate and the first junction of each of the plurality of the thermocouples, each of the thermocouple supports supporting the corresponding first junction.

7. The thermoelectric conversion device as claimed in claim 1, wherein each of the plurality of thermocouples includes:

a fixed portion having the first junction and fixed to the main surface of the substrate;

a lifting portion fixed to the top plate and including the second junction; and a bendable connecting portion arranged between the fixed portion and the lifting portion.

* * * * *